US008791735B1

(12) United States Patent
Shibasaki

(10) Patent No.: US 8,791,735 B1
(45) Date of Patent: Jul. 29, 2014

(54) RECEIVING CIRCUIT AND CONTROL METHOD OF RECEIVING CIRCUIT

(71) Applicant: Fujitsu Limited, Kawasaki (JP)

(72) Inventor: Takayuki Shibasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/173,515

(22) Filed: Feb. 5, 2014

(51) Int. Cl.
*H03L 7/06* (2006.01)

(52) U.S. Cl.
CPC .......................................... *H03L 7/06* (2013.01)
USPC ............................ 327/156; 327/147; 375/233

(58) Field of Classification Search
USPC .................................. 327/147, 156; 375/233
See application file for complete search history.

(56) References Cited

U.S. PATENT DOCUMENTS

| 6,731,148 | B2 * | 5/2004 | Lau et al. | 327/158 |
| 6,954,095 | B2 * | 10/2005 | Lau et al. | 327/158 |
| 7,782,935 | B1 * | 8/2010 | Wong et al. | 375/233 |
| 8,027,409 | B2 * | 9/2011 | Aziz et al. | 375/316 |
| 8,040,988 | B2 * | 10/2011 | Chang et al. | 375/354 |
| 8,120,395 | B2 * | 2/2012 | Williams et al. | 327/156 |
| 8,325,792 | B2 * | 12/2012 | Sunaga et al. | 375/233 |
| 2002/0140473 | A1 * | 10/2002 | Lau et al. | 327/158 |
| 2009/0190283 | A1 * | 7/2009 | Hammerschmidt et al. | 361/240 |
| 2009/0232196 | A1 * | 9/2009 | Sunaga et al. | 375/233 |
| 2012/0140811 | A1 | 6/2012 | Shibasaki | |
| 2012/0200325 | A1 * | 8/2012 | Werner | 327/156 |
| 2013/0169328 | A1 * | 7/2013 | Shibasaki | 327/156 |
| 2014/0097878 | A1 * | 4/2014 | Sindalovsky et al. | 327/156 |

FOREIGN PATENT DOCUMENTS

JP        2009-225018 A     10/2009
JP        2012-124593 A     6/2012

* cited by examiner

*Primary Examiner* — Adam Houston
(74) *Attorney, Agent, or Firm* — Arent Fox LLP

(57) ABSTRACT

A receiving circuit includes: a sampling circuit to sample input data in synchronization with first clock to obtain boundary data, and sample the input data in synchronization with second clock to obtain center data; a decision feedback equalizer to perform equalization on the center data using an equalization coefficient, and output first output data; a first comparator circuit to perform binary decision on the boundary data and output second output data; a phase detection circuit to detect phase information of the input data using the first output data and the second output data; a phase difference computation circuit to calculate phase difference of the first output data using the equalization coefficient; a first phase adjustment circuit to adjust phase of the first clock using the phase information; and a second phase adjustment circuit to adjust phase of the second clock using the phase information and the phase difference.

16 Claims, 14 Drawing Sheets

FIG. 9A
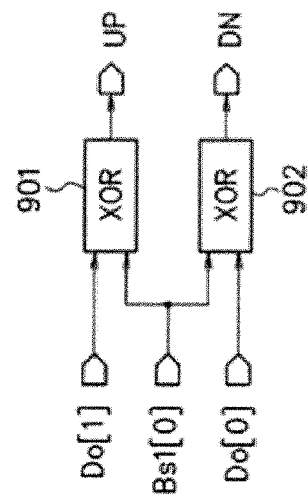
FIG. 9B
| Do[0] | Bs1[0] | Do[1] | UP | DN |
|---|---|---|---|---|
| 0 | 0 | 0 | 0 | 0 |
| 0 | 0 | 1 | 1 | 1 |
| 0 | 1 | 0 | 1 | 1 |
| 0 | 1 | 1 | 0 | 0 |
| 1 | 0 | 0 | 0 | 0 |
| 1 | 0 | 1 | 1 | 1 |
| 1 | 1 | 0 | 0 | 1 |
| 1 | 1 | 1 | 0 | 0 |
FIG. 9C
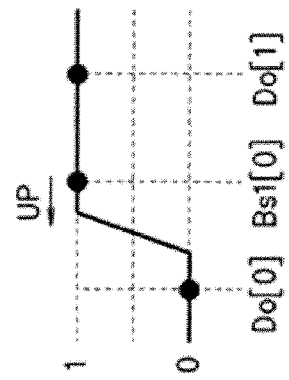
FIG. 9D
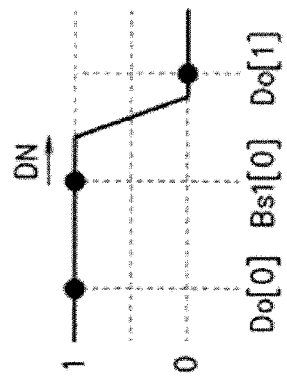

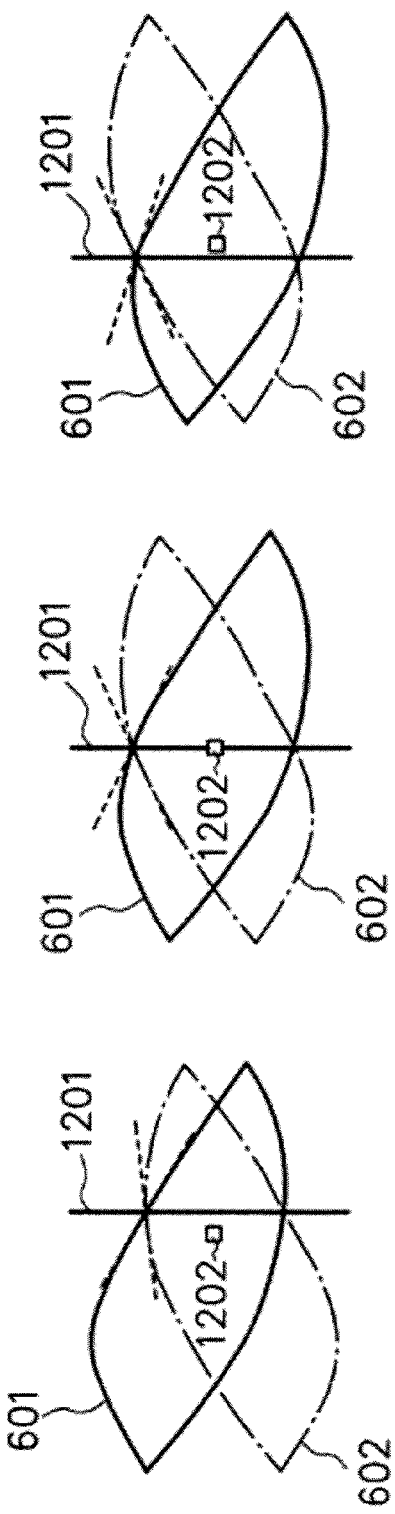

RECEIVING CIRCUIT AND CONTROL METHOD OF RECEIVING CIRCUIT

CROSS-REFERENCE TO RELATED APPLICATIONS

This application is based upon and claims the benefit of priority from the prior Japanese Patent Application No. 2013-077887 filed on Apr. 3, 2013, the entire contents of which are incorporated herein by reference.

FIELD

The embodiment discussed herein is related to a receiving circuit and a control method of the receiving circuit.

BACKGROUND

Performance of information processing equipment, such as a communication apparatus and a server, has been improved, and it is desirable to increase a data rate for signal transmission/reception within/outside of an apparatus. A receiving circuit performs clock and data recovery (CDR) on data having a high-speed data rate.

The related art is disclosed in Japanese Laid-open Patent Publication No. 2009-225018 and No. 2012-124593.

SUMMARY

According to an aspect of the embodiments, a receiving circuit includes: a sampling circuit configured to sample an input data signal in synchronization with a first clock signal to obtain boundary data, and sample the input data signal in synchronization with a second clock signal to obtain center data; a decision feedback equalizer configured to perform equalization and binary decision on the center data using an equalization coefficient, and output a first output data signal; a first comparator circuit configured to perform binary decision on the boundary data and output a second output data signal; a phase detection circuit configured to detect phase information of the input data signal based on the first output data signal and the second output data signal; a phase difference computation circuit configured to calculate a phase difference of the first output data signal based on the equalization coefficient; a first phase adjustment circuit configured to adjust a phase of the first clock signal based on the phase information; and a second phase adjustment circuit configured to adjust a phase of the second clock signal based on the phase information and the phase difference.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 9A to 9D illustrate an example of a phase detection circuit;
FIGS. 12A to 12C illustrate an example of convergence of a receiving circuit.

DESCRIPTION OF EMBODIMENT

A decision feedback equalization apparatus may have an odd data receiving unit and an even data receiving unit. The odd data receiving unit has a half-rate decision feedback equalization (DFE) function of receiving an odd data sampling clock, an odd edge sampling clock, and a DFE input signal. The even data receiving unit has a half-rate DFE function of receiving an even data sampling clock, an even edge sampling clock, and a DFE input signal. Each of the odd data receiving unit and the even data receiving unit has a data detection unit and an edge detection unit using a half-rate DFE signal. The detection unit detects a data detection pattern having three contiguous bits, for example, a data pattern of 110 or 001, from a received sampling data group. When a pattern of 110 or 001 is detected, a pattern filter selects edge data in the half-rate DFE signal based on the detection result.

A receiving circuit has a sampling circuit which samples an input data signal based on a clock signal to output a sampling signal. A data interpolation circuit interpolates the sampling signal based on phase information of the sampling signal of the input data signal to output an interpolated data signal. An interpolation error determination circuit outputs an interpolation error based on the sampling signal and the phase information. A decision equalizer equalizes the interpolated data signal by using an equalization coefficient which is set based on the interpolation error, and checks the interpolated data signal which has been equalized, so as to output a check result signal. A phase detection circuit generates phase information based on the check result signal or the interpolated data signal which has been equalized, and outputs the phase information to the data interpolation circuit and the interpolation error determination circuit.

An equalizer produces a phase shift in accordance with an equalization amount. In a system using a decision feedback equalizer or the like in which equalization is performed after sampling, a phase shift causes the sampling phase to be shifted from the optimal sampling phase, whereby the check error rate may be increased.

Figure 1:
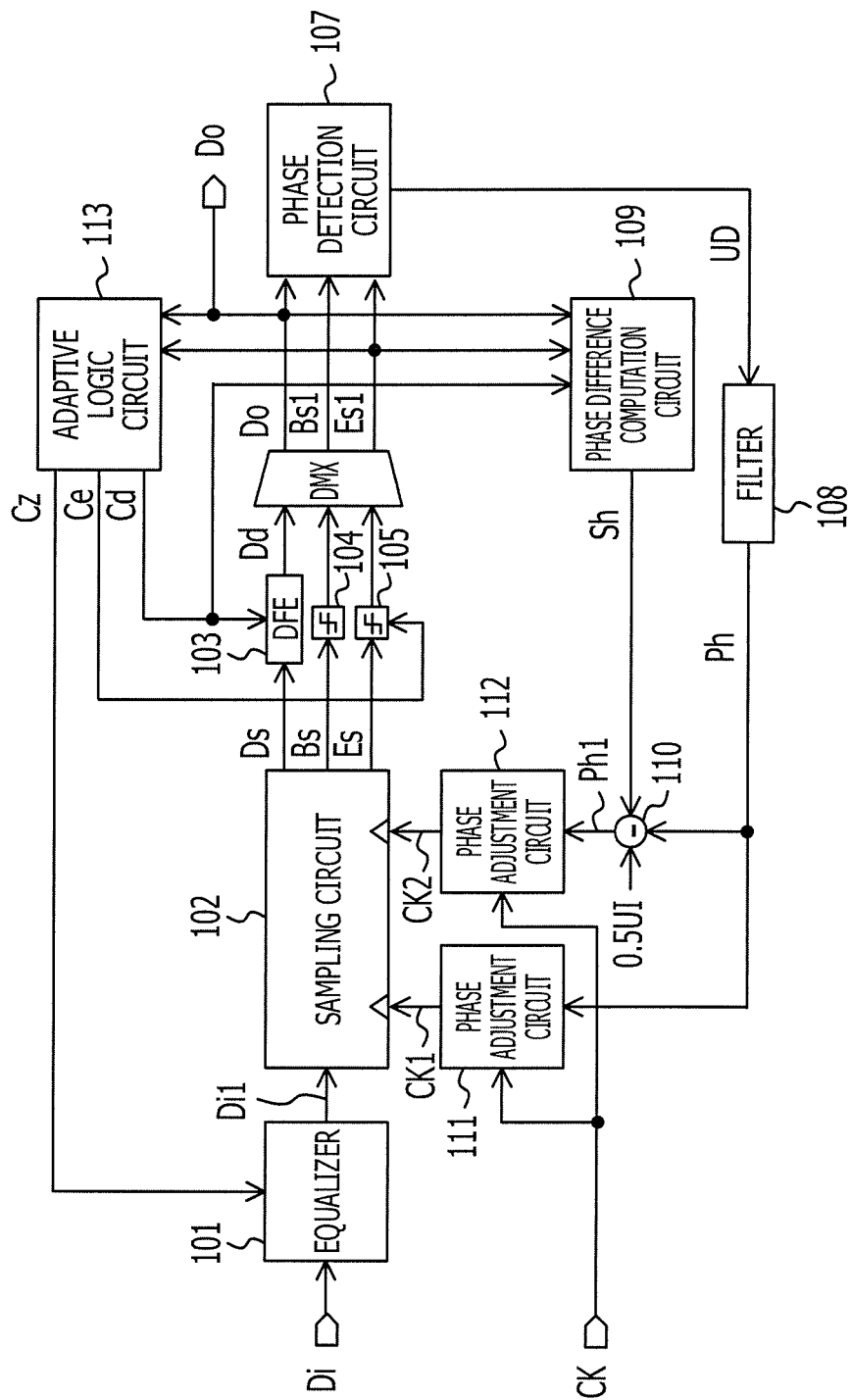
FIG. 1 illustrates an example of receiving circuit.

FIG. 1 illustrates an example of a receiving circuit. The receiving circuit may be, for example, a receiving circuit in a high-speed input-output I/O circuit for transmitting/receiving a high bit-rate signal within an integrated circuit chip or between chips (within an apparatus or between apparatuses). The receiving circuit performs clock and data recovery (CDR) on the basis of a high-speed data-rate input data signal Di.

An equalizer 101 equalizes the input data signal Di based on an equalization coefficient Cz, and outputs an input data signal Di1 which has been equalized, to a sampling circuit 102. The receiving circuit receives the input data signal Di via a transmission line from a transmitting circuit. The transmitting circuit transmits a binary pulse signal. Depending on the characteristics of the transmission line, the receiving circuit may receive the input data signal Di in which the pulse signal has a slow rising rate and a slow falling rate. To remove the characteristics of the transmission line, the equalizer 101 equalizes the input data signal Di to output the input data signal Di1 which becomes closer to a transmission pulse signal from the transmitting circuit. The input data signal Di1 may have a rising rate and/or a falling rate which is higher than that of the input data signal Di.

Figure 2:
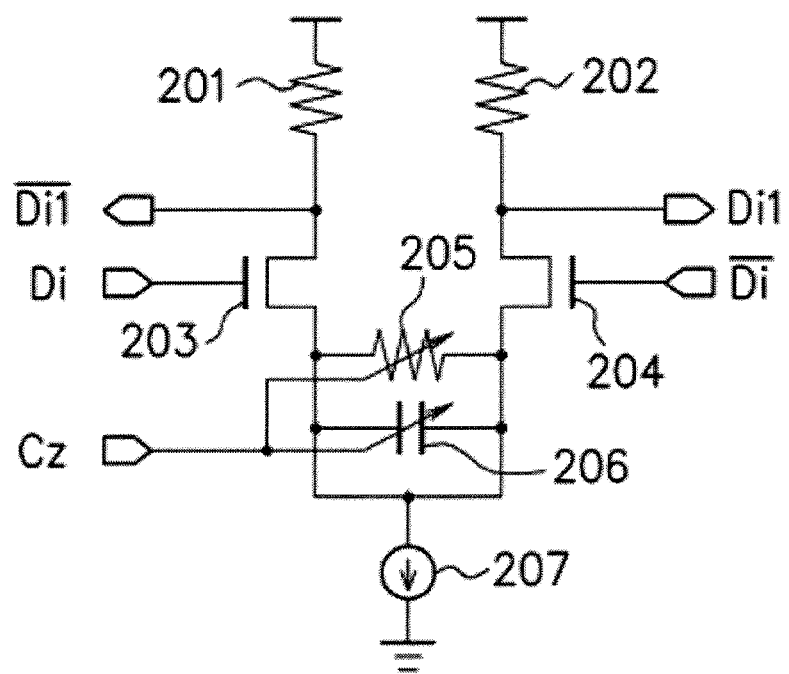
FIG. 2 illustrates an example of an equalizer.

FIG. 2 illustrates an example of an equalizer. FIG. 2 may illustrate the equalizer 101 in FIG. 1. In FIG. 1, a single-end signal is illustrated, whereas, in FIG. 2, differential signals are illustrated. Differential input data signals Di and /Di may be signals whose phases are inverted to each other. The equalizer 101 receives the differential input data signals Di and /Di, and outputs differential input data signals Di1 and /Di1.

A resistance 201 is coupled between a power supply node and a node of the input data signal /Di1. The resistance 202 is coupled between a power supply node and a node of the input data signal Di1. An n-channel field effect transistor 203 has a drain coupled to the node of the input data signal /Di1, and has a gate coupled to the node of the input data signal Di. An n-channel field effect transistor 204 has a drain coupled to the node of the input data signal Di1, and has a gate coupled to the node of the input data signal /Di. A variable resistance 205 is coupled between the source of the transistor 203 and the source of the transistor 204, and the value of the variable resistance 205 is changed depending on the equalization coefficient Cz. A variable capacitance 206 is coupled between the source of the transistor 203 and the source of the transistor 204, and the capacitance value is changed depending on the equalization coefficient Cz. A current source 207 is coupled between a ground potential node and a connecting point of the sources of the transistors 203 and 204.

The equalizer 101 illustrated in FIG. 2 may be a continuous time linear equalizer (CTLE) circuit. The CTLE circuit decreases the gains of low-frequency components based on the variable resistance 205 between the sources of the differential input transistors 203 and 204, and emphasizes high-frequency components in an equivalent manner, and restores high-frequency components of the input data signal. The emphasized gains and frequency characteristics are adjusted by changing the capacitance value of the variable capacitance 206 and/or the resistance value of the variable resistance 205 by using the equalization coefficient Cz.

The sampling circuit 102 illustrated in FIG. 1 samples the input data signal Di1 in synchronization with a first clock signal CK1 to obtain boundary data Bs, and samples the input data signal Di1 in synchronization with a second clock signal CK2 to obtain center data Ds and data for error Es.

Figure 3:
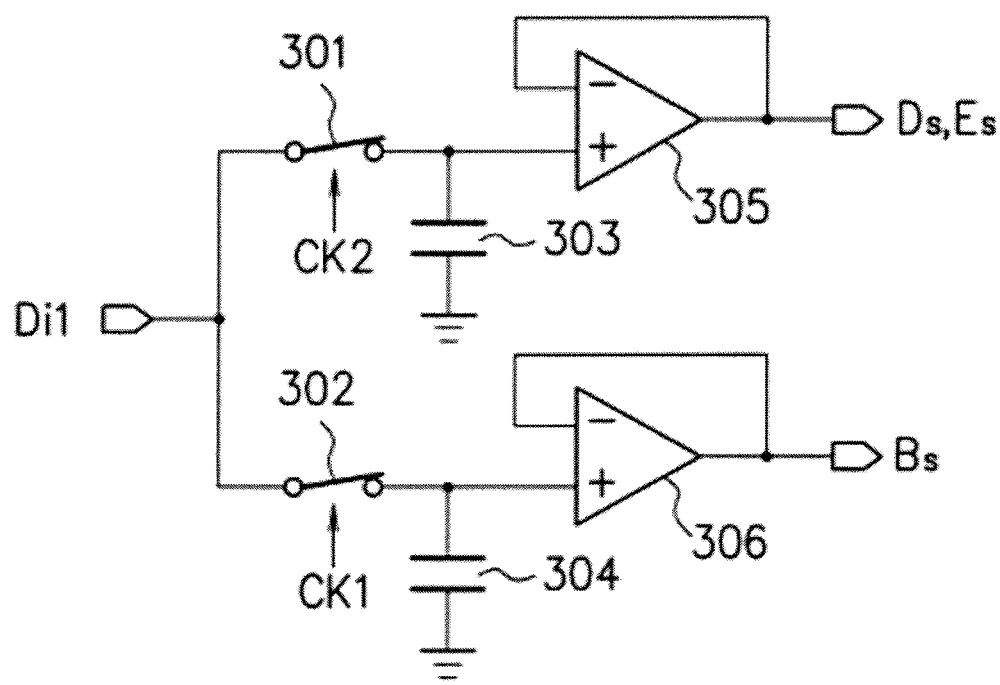
FIG. 3 illustrates an example of a sampling circuit.

FIG. 3 illustrates an example of a sampling circuit. The sampling circuit illustrated in FIG. 3 may be the sampling circuit in FIG. 1. When the first clock signal CK1 is set to the high level, a switch 302 couples a node of the input data signal Di1 to a capacitance 304. When the first clock signal CK1 is set to the low level, the switch 302 detaches the node of the input data signal Di1 from the capacitance 304. When the second clock signal CK2 is set to the high level, a switch 301 couples the node of the input data signal Di1 to a capacitance 303. When the second clock signal CK2 is set to the low level, the switch 301 detaches the node of the input data signal Di1 from the capacitance 303. An operational amplifier 306 amplifies the voltage of the capacitance 304 to output the boundary data Bs. An operational amplifier 305 amplifies the voltage of the capacitance 303 to output the center data Ds and the data for error Es. The center data Ds and the data for error Es may have substantially the same value.

Figures 4A, 4B:
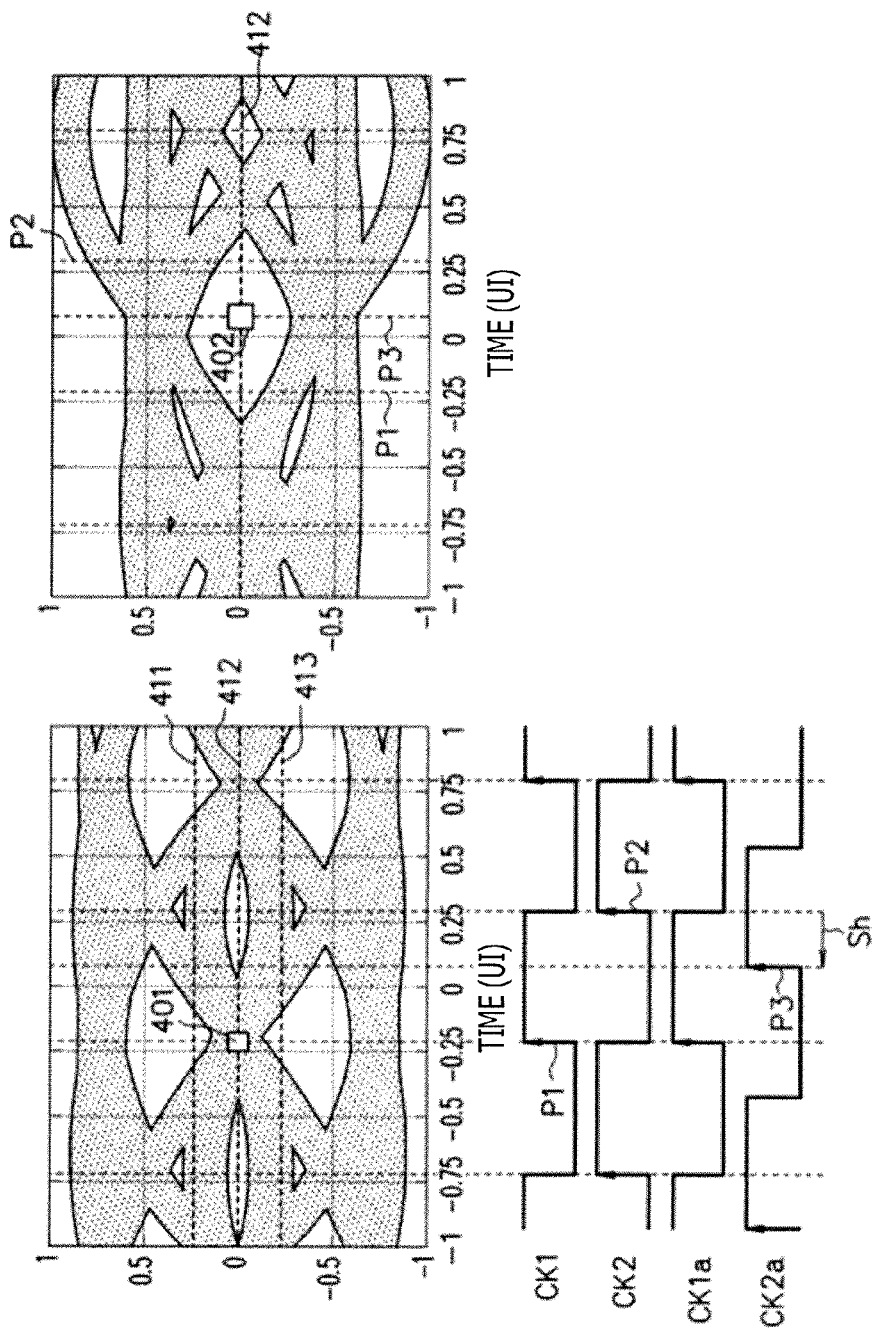
FIG. 4A illustrates an example of an output of a sampling circuit.
FIG. 4B illustrates an example of an output of a decision feedback equalizer.

FIG. 4A illustrates an example of an output of a sampling circuit. FIG. 4B illustrates an example of an output of a decision feedback equalizer. The clock signals CK1 and CK2 are signals whose phases are inverted to each other. The sampling circuit 102 performs an interleave operation by using the clock signals CK1 and CK2. As illustrated in FIG. 4A, the sampling circuit 102 samples the input data signal Di1 at timings P1 in synchronization with rising edges of the clock signal CK1 so as to output boundary data 401 (Bs). The sampling circuit 102 samples the input data signal Di1 at timings P2 in synchronization with rising edges of the clock signal CK2 so as to output the center data Ds. The number of interleaves may be 2, may be 2×n (n is an integer), or may be determined depending on the operating speed of the circuit. In FIG. 4A, the two-phase clock signals CK1 and CK2 are illustrated. However, four-phase clock signals whose frequency is a half of that of the signals CK1 and CK2 may be used.

In FIG. 4A, the horizontal axis represents time, and the vertical axis represents an amplitude value. The time represented by the horizontal axis is represented by using a unit interval (UI). One UI is equal to one bit time of the input data signal Di1, and is a time period between two data boundary times (data transition times) which are adjacent to each other. Data having a period of 1 [UI] represents a data transition state of "101010 . . . ". Data having a period of 2 [UI] represents a data transition state of "11001100 . . . ". A timing P1 is a boundary data timing which is a timing for the boundary between two data which are adjacent to each other. A timing P2 is a center data timing which is a timing for the center of one data. The timings P1 and P2 have a phase difference of 0.5 [UI] from each other.

A decision feedback equalizer (DFE) 103 in FIG. 1 uses an equalization coefficient Cd to perform equalization and binary decision on the center data Ds obtained through the sampling by the sampling circuit 102, and outputs binary center data Dd. The center data Dd is represented by a binary of "0" or "1". For example, data "1" indicates that the amplitude value is positive, and data "0" indicates that the amplitude value is negative. The equalizer 101 may be a primary equalizer, and the decision feedback equalizer 103 may be a secondary equalizer.

Figure 5:
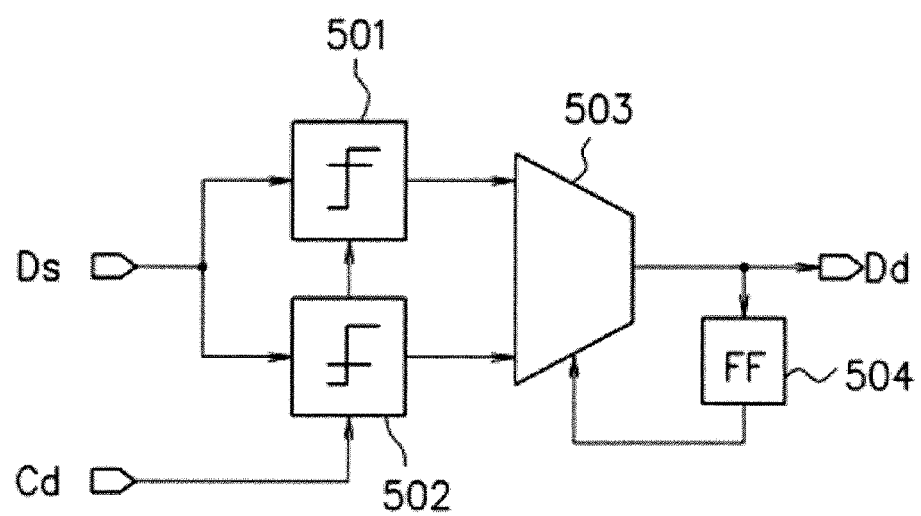
FIG. 5 illustrates an example of a decision feedback equalizer.

FIG. 5 illustrates an example of a decision feedback equalizer. The decision feedback equalizer illustrated in FIG. 5 may be the decision feedback equalizer 103 in FIG. 1. The decision feedback equalizer 103 receives the equalization coefficient Cd, supplies a first equalization coefficient "+Cd" to a comparator circuit 501, and supplies a second equalization coefficient "−Cd" to a comparator circuit 502. The comparator circuit 501 outputs the result of a comparison between the center data Ds and the first equalization coefficient "+Cd". For example, when the center data Ds is larger than the first equalization coefficient "+Cd", the comparator circuit 501 outputs data "1". When the center data Ds is smaller than the first equalization coefficient "+Cd", the comparator circuit 501 outputs data "0". The comparator circuit 502 outputs the result of a comparison between the center data Ds and the second equalization coefficient "−Cd". For example, when the center data Ds is larger than the second equalization coefficient "−Cd", the comparator circuit 502 outputs data "1". When the center data Ds is smaller than the second equalization coefficient "−Cd", the comparator circuit 502 outputs data "0". A selector 503 selects the output data from the comparator circuit 501 when a flip-flop circuit 504 stores data "1", selects the output data from the comparator circuit 502 when the flip-flop circuit 504 stores data "0", and outputs the binary data Dd. The flip-flop circuit 504 stores the output data Dd from the selector 503. For example, the selector 503 selects the output data from the comparator circuit 501 or 502 in accordance with the preceding output data Dd stored in the flip-flop circuit 504.

Figure 6A:
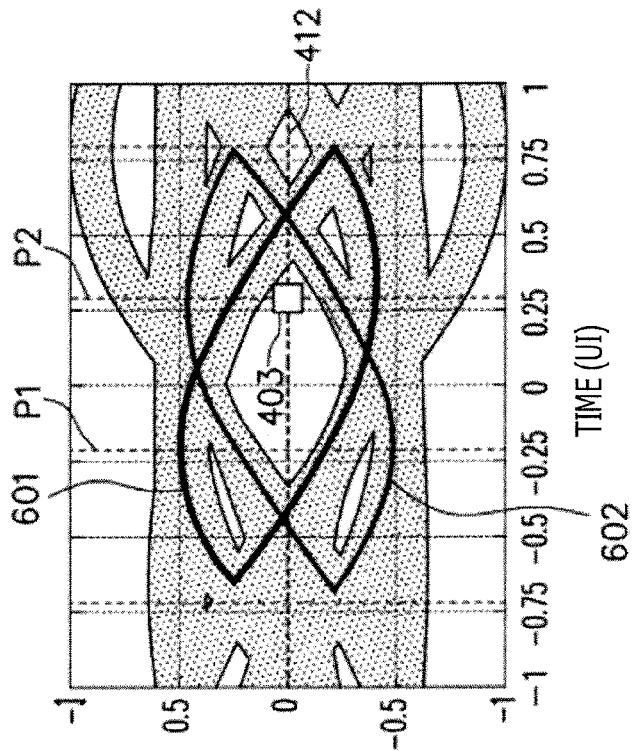
FIG. 6A illustrates an example of an output of a sampling circuit.

FIG. 6A illustrates an example of an output of a sampling circuit. FIG. 6A illustrates output data of the sampling circuit 102. FIG. 6A may correspond to FIG. 4A. A data transition 601 represents a transition from the preceding data "1" to the current data "1" or "0" in a data pattern of "11001100 . . . ". The position of a center amplitude value 411 of the data transition 601 is located above the position of the amplitude value "0". Therefore, in the case where the preceding data is "1", the comparator circuit 501 outputs data "1" when the center data Ds is larger than the first equalization coefficient 411 (="+Cd"), and outputs data "0" when the center data Ds is smaller than the first equalization coefficient 411 (="+Cd").

A data transition 602 represents a transition from the preceding data "0" to the current data "1" or "0" in a data pattern of "11001100 . . . ". The position of a center amplitude value 413 of the data transition 602 is located below the position of the amplitude value "0". Therefore, in the case where the preceding data is "0", the comparator circuit 502 outputs data "1" when the center data Ds is larger than the second equalization coefficient 413 (="−Cd"), and outputs data "0" when the center data Ds is smaller than the second equalization coefficient 413 (="−Cd").

The decision feedback equalizer 103 in FIG. 5 may be a 1-tap decision feedback equalizer. The selector 503 performs selection in accordance with the preceding output data Dd, enabling high-speed processing. The decision feedback equalizer 103 may have one tap or may have multiple taps. For example, four comparator circuits 501, 502, and the like are provided for the decision feedback equalizer 103 having two taps. One of output data from the four comparator circuits 501, 502, and the like may be selected in accordance with output data Dd corresponding to the immediately preceding bit and the bit just before the immediately preceding bit. Similarly, comparator circuits 501, 502, and the like, the number of which is $2^m$, may be provided for the decision feedback equalizer 103 having m taps.

Figure 6B:
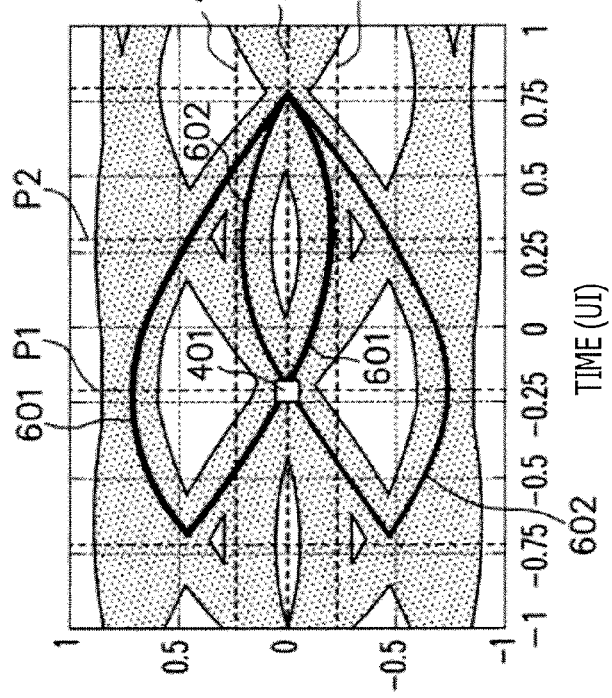
FIG. 6B illustrates an example of a decision feedback equalizer.

FIG. 6B illustrates an example of a decision feedback equalizer. FIG. 6B illustrates output data of the decision feedback equalizer 103. FIG. 6B equivalently indicates the case in which the decision feedback equalizer 103 uses a threshold 412 of the amplitude value "0" to check data in the data transitions 601 and 602. The data 401 at the timing P1 in FIG. 6A is the boundary data Bs. Data 403 at the timing P2 in FIG. 6B is the center data Dd. For example, the center data timing P2 in FIG. 6A is located in the center phase of the data, whereas the data 403 at the center data timing P2 in FIG. 6B is shifted to a position (right-side position) behind the center phase of the data because of the equalization process performed by the decision feedback equalizer 103. In the decision feedback equalizer 103, if sampling data in the center phase of the data is checked, the check error rate may be decreased. If the sampling data 403 at the shifted timing P2 is checked, the check error rate may be increased. Therefore, the sampling timing P2 for the center data 403 is adjusted, whereby the check error rate of the decision feedback equalizer 103 may be reduced.

A first comparator circuit 104 in FIG. 1 performs binary decision on the boundary data Bs obtained through the sampling performed by the sampling circuit 102, and outputs binary boundary data. For example, the first comparator circuit 104 outputs "1" when the amplitude value of the boundary data Bs is larger than "0", and outputs "0" when the amplitude value of the boundary data Bs is smaller than "0".

A second comparator circuit 105 compares a threshold Ce with the data for error Es (=center data Ds) obtained through the sampling performed by the sampling circuit 102, and outputs binary data for error. For example, the second comparator circuit 105 outputs data for error "1" when the absolute value of the data for error Es is smaller than the threshold Ce, and outputs data for error "0" when the absolute value of the data for error Es is larger than the threshold Ce.

An inverse multiplexing circuit 106 inversely multiplexes the output data from the decision feedback equalizer 103, the output data from the first comparator circuit 104, and the output data from the second comparator circuit 105, and outputs center data Do, boundary data Bs1, and data for error Es1, respectively. For example, the inverse multiplexing circuit 106 converts a high-frequency serial signal into a low-frequency parallel signal. The output data from the inverse multiplexing circuit 106 has a low-speed data rate. Therefore, in a phase detection circuit 107, a phase difference computation circuit 109, and an adaptive logic circuit 113 which are located downstream, low-speed processing may be performed. The center data Do is output data from the receiving circuit.

The adaptive logic circuit 113 in FIG. 1 calculates the equalization coefficient Cz, the threshold Ce, and the equalization coefficient Cd based on the center data Do and the data for error Es1, and outputs the equalization coefficient Cz, the threshold Ce, and the equalization coefficient Cd. The adaptive logic circuit 113 sequentially optimizes the equalization coefficient Cd or the like, for example, by using a least mean square (LMS) algorithm. For example, through the following expression, the adaptive logic circuit 113 may use the equalization coefficient Cd(n−1) of the (n−1)th sampling data, the data for error Es(n) of the nth sampling data, and the center data Do(n−1) of the (n−1)th sampling data to derive the equalization coefficient Cd(n) of the nth sampling data. The symbol μ represents steps. Similarly to the equalization coefficient Cd, the adaptive logic circuit 113 calculates the equalization coefficient Cz.

$$Cd(n)=Cd(n-1)-\mu \times Es1(n) \times Do(n-1)$$

Figure 7A:
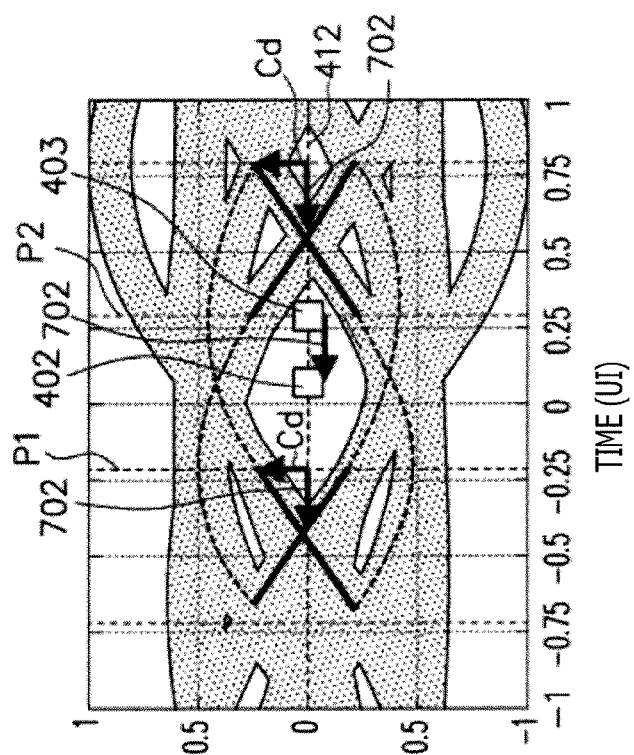
FIG. 7A illustrates an example of a sampling circuit.

FIG. 7A illustrates an example of an sampling circuit. FIG. 7A may correspond to FIG. 6A, and may illustrate an output of the sampling circuit 102 illustrated in FIG. 1. The boundary data 401 is located in the phase of the zero crossing point at which the data transitions 601 and 602 cross each other at the position of the amplitude value "0". The solid lines of the data transitions 601 and 602 at and near the zero crossing point may be analogous to straight lines. The first equalization coefficient 411 is the equalization coefficient Cd, and may be a known value. The inclination of the solid line of the data transitions 601 and 602 may correspond to the slew rate (inclination of a waveform). Accordingly, if the inclination of the line is determined, a phase difference 702 is calculated based on the inclination of the line and the equalization coefficient Cd.

Figure 7B:
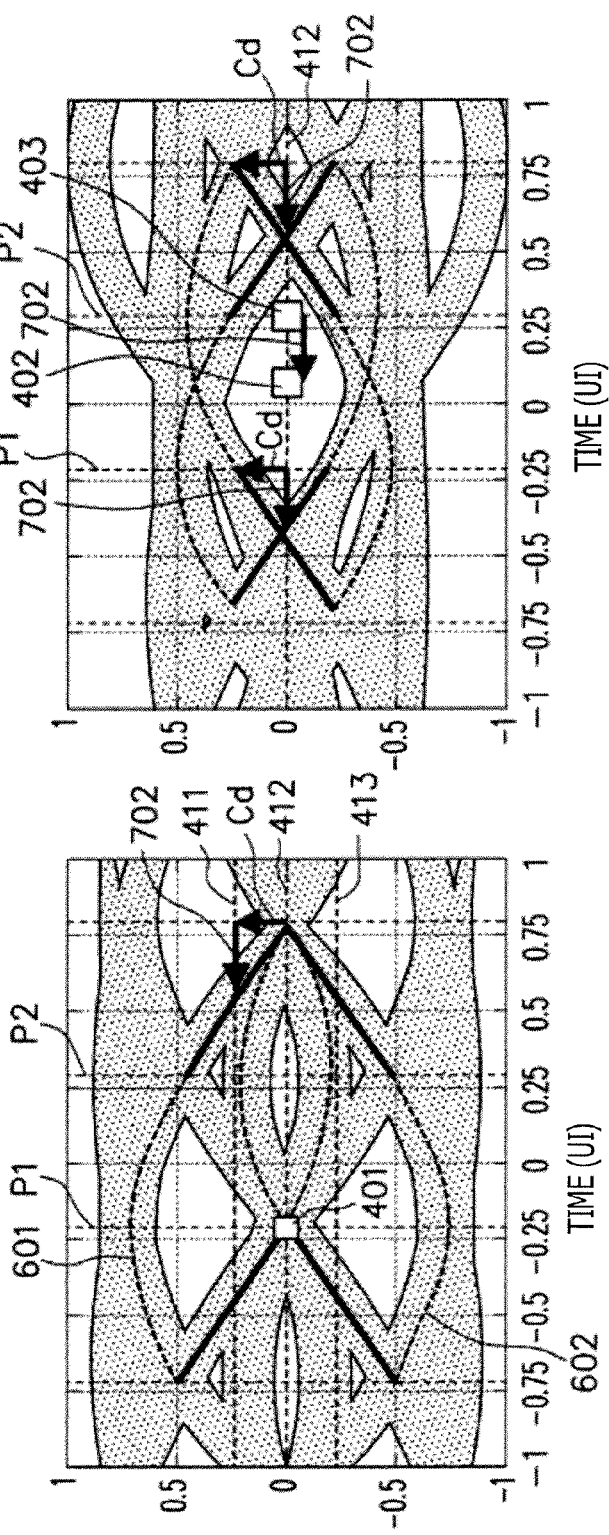
FIG. 7B illustrates an example of an output of a decision feedback equalizer.

FIG. 7B illustrates an exemplary output of the decision feedback equalizer. FIG. 7B may correspond to FIG. 6B, and may illustrate an output of the decision feedback equalizer 103 illustrated in FIG. 1. As described above, the center data 403 has a deviation corresponding to the phase difference 702 with respect to the center phase of the data based on the equalization process performed by the decision feedback equalizer 103. The phase difference 702 is calculated based on the inclination of the line and the equalization coefficient Cd. By shifting the phase of the center data 403 ahead by the phase difference 702, center data 402 in the center phase of the data may be obtained. If the decision feedback equalizer 103 checks the center data 402 in the data center phase, the check error rate may be reduced.

The phase difference computation circuit 109 in FIG. 1 calculates the phase difference 702. For example, the phase difference computation circuit 109 calculates a phase difference Sh for the output data of the decision feedback equalizer 103 based on the equalization coefficient Cd of the decision feedback equalizer 103, the data for error Es1, and the center data Do. The phase difference Sh may correspond to the phase difference 702 in FIG. 7B.

Figure 8:
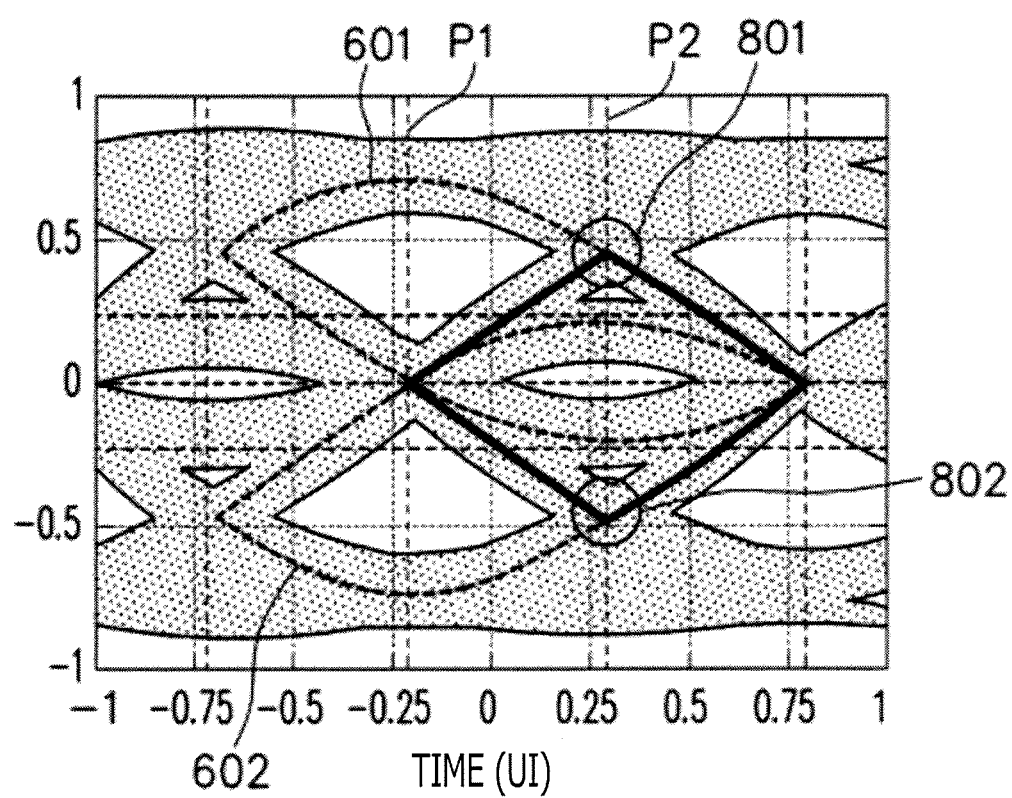
FIG. 8 illustrates an example of a calculation method of a phase difference computation circuit.

FIG. 8 illustrates an example of a calculation method of a phase difference computation circuit. FIG. 8 may correspond to FIG. 7A, and may illustrate a calculation method used in the phase difference computation circuit 109 in FIG. 1. The phase difference computation circuit 109 detects cross points 801 and 802 of straight lines at which the data transitions 601 and 602 are approximated at the sampling timing P2. At the time point when a time of 0.5 [UI] has elapsed after the timing P2, the data transitions 601 and 602 cross at the point of amplitude value "0". The solid lines passing through the cross points 801 and 802 of the data transitions 601 and 602 may be approximated straight lines. The adaptive logic circuit 113 changes the threshold Ce; the second comparator circuit 105 compares the absolute value of the data for error Es (center data Ds) with the threshold Ce; and the phase difference computation circuit 109 receives the comparison result from the second comparator circuit 105. Thus, the phase difference computation circuit 109 determines whether or not the center data Ds at the timing P2 is within the range between +Cs and −Cs. By changing the threshold Cs, the phase difference computation circuit 109 determines the amplitude value of the cross points 801 and 802. The threshold Cs may be also used as a threshold for error monitoring which is used by the adaptive logic circuit 113.

For example, the amplitude value of the cross point 801 may be determined to be "0.42". The phase difference computation circuit 109 receives "0.22" as the equalization coefficient Cd from the adaptive logic circuit 113. The phase difference computation circuit 109 calculates the slew rate (inclination) of the solid line connecting between the cross point 801 and the zero cross point located at a time point when a time of 0.5 [UI] has elapsed after the cross point 801, by using the equation 0.42/0.5=0.84. The phase difference computation circuit 109 calculates the phase difference 702 (Sh) by using the equation 0.22/0.84=0.26.

For example, the phase difference computation circuit 109 performs the following calculation so as to derive the phase difference Sh. The coefficient Cd is an equalization coefficient, and AC is an absolute value of the amplitude value of the cross point 801 or 802.

$$Sh = Cd/(2 \times AC)$$

The phase detection circuit 107 in FIG. 1 receives the center data Do and the boundary data Bs1, detects phase information UD of the input data signal Di based on the center data Do and the boundary data Bs1, and outputs it.

FIGS. 9A to 9D illustrate an example of a phase detection circuit. FIG. 9A may illustrate the phase detection circuit 107 in FIG. 1. The phase detection circuit 107 has exclusive OR (XOR) circuits 901 and 902. As illustrated in FIGS. 9C to 9D, the center data Do[0] is the center data Do in a first cycle. The center data Do[1] is the center data Do in a second cycle which is the next cycle of the first cycle. The boundary data Bs1[0] is the boundary data Bs1 between the center data Do[0] and Do[1]. The exclusive OR circuit 901 outputs the exclusive OR data of the center data Do[1] and the boundary data Bs1[0] as a bit UP. The exclusive OR circuit 902 outputs exclusive OR data of the center data Do[0] and the boundary data Bs1[0] as a bit DN. As illustrated in FIG. 9B, the phase detection circuit 107 receives the data Do[0], Do[1], and Bs1[0], and outputs the 2-bit phase data UP and DN. The 2-bit phase data UP and DN may correspond to the phase information UD in FIG. 1.

FIG. 9C illustrates a case in which the phase of the boundary data Bs1[0] is ahead of the boundary phase (data transition phase). For example, the center data Do[0] and the boundary data Bs1[0] are "1", and the next center data Do[1] is "0". In this case, since the phase of the boundary data Bs1[0] is ahead of the boundary phase (data transition phase), in order to delay the sampling phase, a down bit DN of "1" is output.

FIG. 9D illustrates a case in which the phase of the boundary data Bs1[0] is behind the boundary phase (data transition phase). For example, the center data Do[0] is "0", and the boundary data Bs1[0] and the next center data Do[1] are "1". In this case, since the phase of the boundary data Bs1[0] is behind the boundary phase (data transition phase), an up bit UP of "1" is output.

As described above, when a change in the data value occurs, the phase detection circuit 107 detects a deviation of the phase based on the determination as to which data, the preceding center data Do[0] or the subsequent center data Do[1], has the same value as that of the boundary data Bs1[0]. FIGS. 9A to 9D illustrate a configuration for the detection performed between continuous two-bit data. The phase detection may be performed between two adjacent data in multiple-bit data generated by the inverse multiplexing circuit 106.

A filter 108 in FIG. 1, which may be a low pass filter, performs low pass filtering on the phase information UD detected by the phase detection circuit 107, and outputs phase information Ph. The filter 108 removes high-frequency noise and outputs the averaged phase information Ph. Use of the filter 108 causes the rapid change in the phase information Ph to be reduced, whereby the change in the phase information Ph may be suppressed.

A first phase adjustment circuit 111 adjusts the phase of the first clock signal CK1 by using a reference clock signal CK in accordance with the phase information Ph. In the case where the up bit UP is "1", control is exerted so that the phase of the first clock signal CK1 is shifted forward. In the case where the down bit DN is "1", control is exerted so that the phase of the first clock signal CK1 is shifted backward. Thus, control is exerted so that the phase of the boundary data Bs1[0] in FIGS. 9C and 9D matches the boundary phase (data transition phase).

A subtracter 110 adds the phase information Ph and 0.5 [UI] together, subtracts the phase difference Sh from the addition result, and outputs phase information Ph1. A second phase adjustment circuit 112 adjusts the phase of the second clock signal CK2 by using the reference clock signal CK in accordance with the phase information Ph1. In the case where the above-described up bit UP is "1", control is exerted so that the phase of the second clock signal CK2 is shifted forward.

In the case where the above-described down bit DN is "1", control is exerted so that the phase of the second clock signal CK2 is shifted backward. As illustrated in FIG. 4A, since the center data phase P2 is a phase which is behind the boundary data phase P1 by 0.5 [UI], the subtracter 110 adds 0.5 [UI]. The phase difference Sh may correspond to the phase difference 702 in FIG. 7B. As illustrated in FIG. 7B, the subtracter 110 subtracts the phase difference 702 (Sh), thereby changing the phase of the center data 403 to the phase of the adequate center data 402.

In FIG. 4A, the first clock signal CK1 and the second clock signal CK2 represent an example of clock signals before phase adjustment, and a first clock signal CK1a and a second clock signal CK2a represent an example of clock signals after the phase adjustment. Before the phase adjustment, the second clock signal CK2 is behind the first clock signal CK1 by 0.5 [UI]. In the case where the phase difference computation circuit 109 calculates the phase difference Sh, the first clock signal CK1a after the phase adjustment has substantially the same phase as the first clock signal CK1 before the phase adjustment. In contrast, the second clock signal CK2a after the phase adjustment has a phase which is adjusted so as to be ahead of the second clock signal CK2 before the phase adjustment by the phase difference Sh. After the phase adjustment, the sampling circuit 102 performs sampling in synchronization with rising phases P1 of the first clock signal CK1a to obtain the boundary data Bs, and performs sampling in synchronization with rising phases P3 of the second clock signal CK2a to obtain the center data Ds and the data for error Es.

FIG. 4B may correspond to FIG. 7B, and illustrates an example of an output of the decision feedback equalizer 103 at the time when sampling is performed by using the first clock signal CK1a and the second clock signal CK2a after the phase adjustment. The decision feedback equalizer 103 checks the center data 402 obtained through sampling using the phase P3. The center data 402 has been adjusted by using the center phase P3. Accordingly, the check error rate of the decision feedback equalizer 103 may be reduced.

Figure 10:
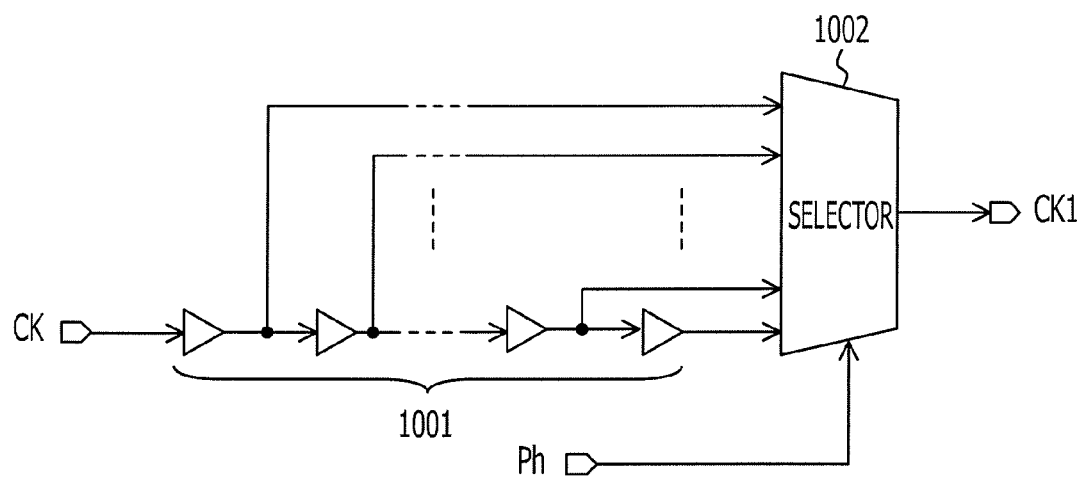
FIG. 10 illustrates an example of a first phase adjustment circuit.

FIG. 10 illustrates an example of a first phase adjustment circuit. The first phase adjustment circuit illustrated in FIG. 10 may be the first phase adjustment circuit 111 in FIG. 1. The first phase adjustment circuit 111 includes a variable delay circuit. A series connection circuit 1001 having multiple buffers may be a delay circuit, and delays the reference clock signal CK. A selector 1002 selects one of output signals from the buffers 1001 in accordance with the phase information Ph, and outputs the first clock signal CK1. The first clock signal CK1 may be a signal obtained by delaying the reference clock signal CK by a delay time corresponding to the phase information Ph.

Figure 11:
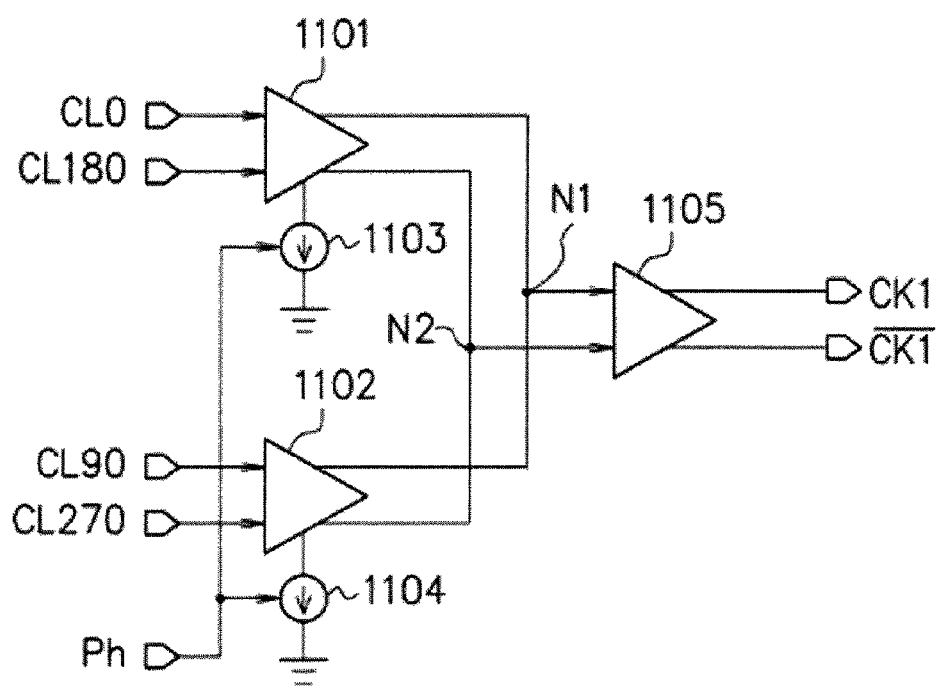
FIG. 11 illustrates an example of a first phase adjustment circuit in FIG. 1.

FIG. 11 illustrates an example of a first phase adjustment circuit in FIG. 1. The first phase adjustment circuit illustrated in FIG. 11 may be the first phase adjustment circuit 111 in FIG. 1. The first phase adjustment circuit 111 includes a phase interpolation circuit. Four-phase reference clock signals CK0, CL90, CL180, and CL270 may correspond to the reference clock signal CK in FIG. 1. The clock signal CK0 may be a clock signal with a 0 degree phase; the clock signal CL90, with a 90 degree phase; the clock signal CL180, with a 180 degree phase; and the clock signal CL270, with a 270 degree phase. A differential amplifier 1101 coupled to a power source 1103 amplifies the differential clock signals CL0 and CL180, and outputs differential clock signals from nodes N1 and N2. A differential amplifier 1102 coupled to a power source 1104 amplifies the differential clock signals CL90 and CL270, and outputs the differential clock signals from the nodes N1 and N2. A differential amplifier 1105 amplifies the differential clock signals from the nodes N1 and N2, and outputs the differential clock signals CK1 and /CK1. The differential clock signals CK1 and /CK1 are signals whose phases are inverted to each other, and may correspond to the first clock signal CK1 in FIG. 1.

The power sources 1103 and 1104 control a current ratio in accordance with the phase information Ph. The output signal from the differential amplifier 1101 and the output signal from the differential amplifier 1102 are added together at the nodes N1 and N2 by using weighting according to the current ratio.

For example, when the current ratio of the power source 1103 to the power source 1104 is 1:0, the first clock signal CK1 may have substantially the same phase as the clock signal CL0 with a 0 degree phase. The first clock signal /CK1 may have substantially the same phase as the clock signal CL180 with a 180 degree phase.

For example, when the current ratio of the power source 1103 to the power source 1104 is 0:1, the first clock signal CK1 may have substantially the same phase as the clock signal CL90 with a 90 degree phase. The first clock signal /CK1 may have substantially the same phase as the clock signal CL270 with a 270 degree phase.

By controlling of the current ratio of the power source 1103 to the power source 1104 in accordance with the phase information Ph, the first clock signals CK1 and /CK1 with any phase in a range of 0 to 360 degree are generated.

The configuration of the second phase adjustment circuit 112 may be substantially the same as or similar to that of the first phase adjustment circuit 111.

FIGS. 12A to 12C illustrate an example of convergence of a receiving circuit. FIGS. 12A to 12C illustrate convergence of the receiving circuit in FIG. 1. FIG. 12A illustrates a case in which the equalization coefficient Cd of the decision feedback equalizer 103 is small. FIG. 12B illustrates a case in which the equalization coefficient Cd of the decision feedback equalizer 103 is optimal. FIG. 12C illustrates a case in which the equalization coefficient Cd of the decision feedback equalizer 103 is large. The equalization coefficient Cd is adjusted so that the opening in the amplitude direction in a region surrounded by the data transitions 601 and 602 becomes maximum in the sampling phase. For example, the converging equalization coefficient Cd may be different depending on a sampling phase. Conversely, a converging phase may be different depending on an equalization coefficient Cd. A phase in which the equalization coefficient Cd converges is represented by a coefficient converging phase 1201. A phase 1202 represents a sampling phase which is shifted by a calculation value obtained by using slew rates at that time. When the equalization coefficient Cd in FIG. 12A is small, the slew rate in a rising portion of the waveform of the data transition 602 is low, and the sampling phase 1202 is located on the left side of the coefficient converging phase 1201. Accordingly, the equalization coefficient Cd is controlled to be increased. In contrast, when the equalization coefficient Cd in FIG. 12C is large, the slew rate in a falling portion of the waveform of the data transition 601 is low, and the sampling phase 1202 is located on the right side of the coefficient converging phase 1201. Accordingly, the equalization coefficient Cd is controlled to be decreased. Finally, as illustrated in FIG. 12B, because of the converge to the phases 1201 and 1202 where the slew rate in the rising portion of the waveform of the data transition 602 and that in the falling portion of the waveform of the data transition 601 are equal, the operation may be stable. In FIG. 12B, the converge to the phase 1202 and the equalization coefficient Cd where the area of the opening of the region surrounded by the data transitions 601 and 602 becomes maximum is performed.

FIGS. 13A to 13F illustrate an example of a simulation result of convergence of a receiving circuit. FIGS. 13A to 13F may correspond to FIGS. 12A to 12C, and illustrate a simulation result of the convergence of the receiving circuit in FIG. 1. The equalization coefficients Cd in FIGS. 13A to 13F may be 0, 0.1, 0.2, 0.3, 0.4, and 0.5. When sampling is performed in a coefficient converging phase AA, probabilities of transition of the equalization coefficient Cd in the up direction UP and the down direction DN are substantially equal, resulting in convergence. In the case where the phase difference computation circuit 109 is not provided, the converge occurs in a state where the equalization coefficient Cd is 0.2. In this case, similarly to FIG. 6B, the coefficient converging phase AA is behind the center phase, whereby the check error rate may be increased.

Figure 13A:
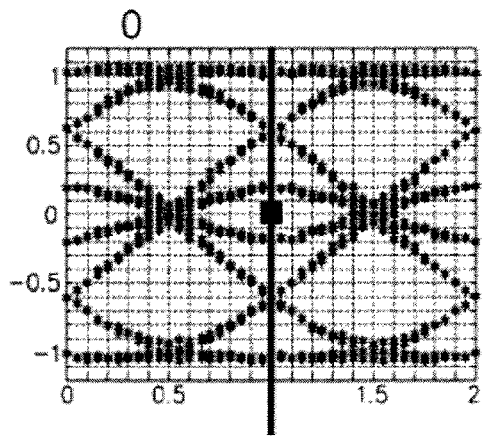
FIGS. 13A to 13F illustrate an example of a simulation result of convergence of a receiving circuit.
Figure 13B:
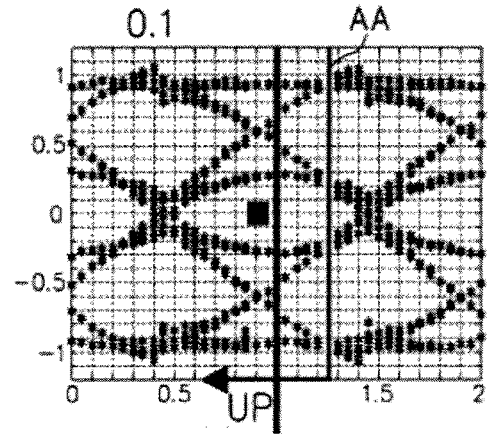
Figure 13C:
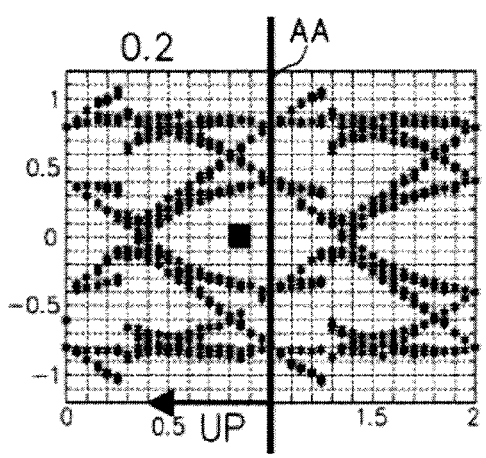
Figure 13D:
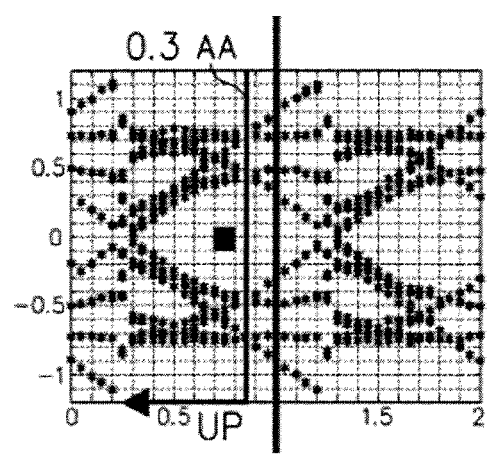
Figure 13E:
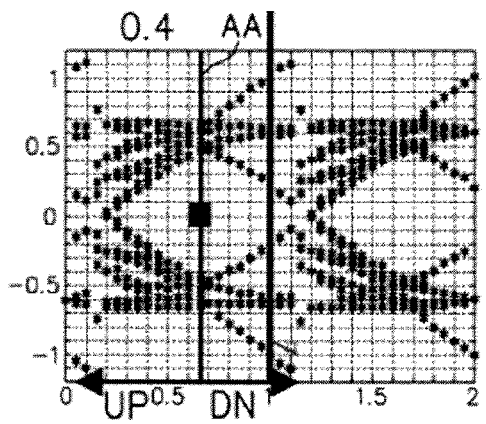
Figure 13F:
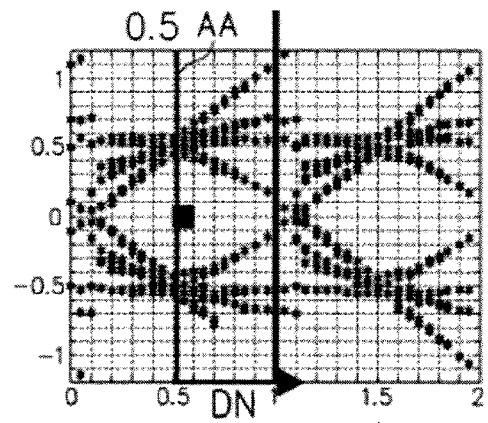

In the case where the phase difference computation circuit 109 is provided, when the equalization coefficients Cd in FIGS. 13A to 13D are 0.1 to 0.3, the equalization coefficient Cd is controlled by using the up bit UP. When the equalization coefficient in FIG. 13F is 0.5, the equalization coefficient Cd is controlled by using the down bit DN. The equalization coefficient Cd is controlled by using the up bit UP in a sampling phase in which the equalization coefficient Cd is small, and the equalization coefficient Cd is controlled by using the down bit DN in a sampling phase in which the equalization coefficient Cd is large. Finally, the equalization coefficient Cd in FIG. 13E converges to 0.4, whereby the check error rate may be decreased as in FIG. 4B.

Figure 14:
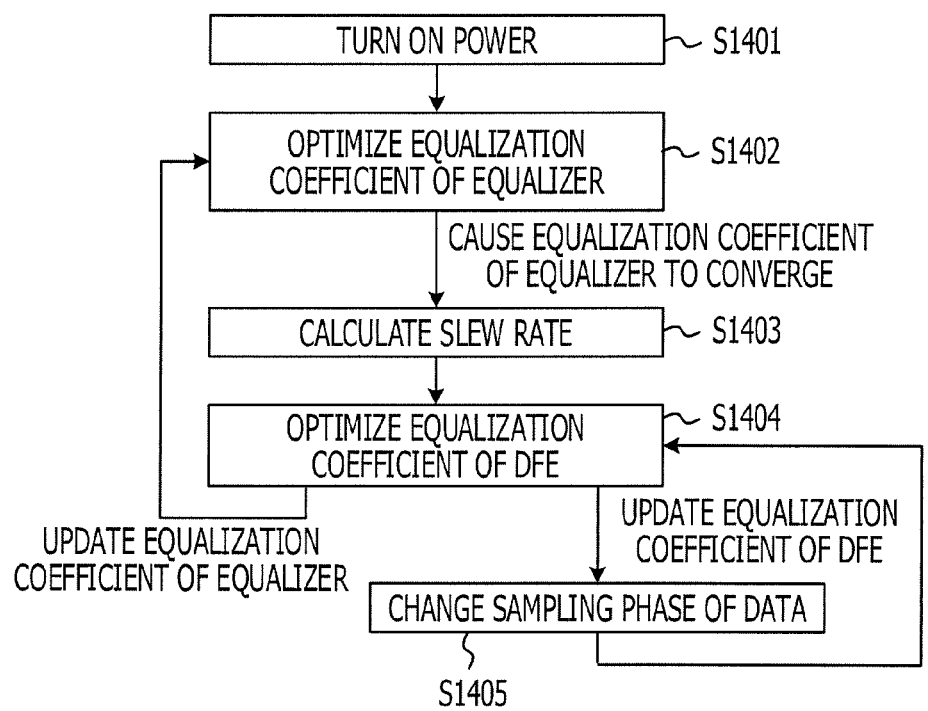
FIG. 14 illustrates an example of a control method of a receiving circuit.

FIG. 14 illustrates an example of a control method of a receiving circuit. FIG. 14 is a flowchart of the control method of the receiving circuit in FIG. 1. In operation S1401, the power of the receiving circuit is turned on. In operation S1402, the adaptive logic circuit 113 causes the equalization coefficient Cz of the equalizer 101 to converge through a feedback process for optimizing the equalization coefficient Cz of the equalizer 101. At that time, the adaptive logic circuit 113 causes the equalization coefficient to converge so that the linearity is improved in data that is monitored for a calculation of the slew rate performed by the phase difference computation circuit 109. Therefore, the detection accuracy of the phase difference Sh may be improved. To improve accuracy in straight-line approximation, the equalization of the equalizer 101 may have accuracy of equalization for data having a "1010" period, or may have accuracy of equalization for data having periods of "0011" and "1100".

After convergence of the equalization coefficient Cz, in operation S1403, the phase difference computation circuit 109 calculates the slew rate. In operation S1404, the adaptive logic circuit 113 starts optimization of the equalization coefficient Cd of the decision feedback equalizer 103, and generates the equalization coefficient Cd.

If the equalization coefficient Cd is updated, in operation S1405, the second phase adjustment circuit 112 adjusts the phase of the second clock signal CK2 in accordance with the phase difference Sh calculated by the phase difference computation circuit 109. The sampling circuit 102 changes the sampling phase for the center data Ds and the data for error Es. The process returns back to operation S1404.

In operation S1404, if the adaptive logic circuit 113 updates the equalization coefficient Cz of the equalizer 101, the process returns back to operation S1402.

The control method is not limited to the above-described control method. For example, optimization of the equalization coefficient Cz of the equalizer 101 in operation S1402 may be performed in the initial operation. After that, no update of the equalization coefficient Cz of the equalizer 101 may be performed until an error occurs. In the optimization of the equalization coefficient Cd of the decision feedback equalizer 103 in operation S1404, when an error occurs, the process returns back to operation S1402, and the adaptive logic circuit 113 updates the equalization coefficient Cz of the equalizer 101.

In the initial operation, the equalizer 101 may receive the input data signal Di including a specific data pattern of "0011" or "1100", as a training sequence. Many data patterns of "0011" or "1100" which are advantageous for detection of the slew rate are received as the input data signal Di, whereby a time for calibration in the initial operation may be reduced. The input data signal Di may include many specific data patterns to improve the detection accuracy.

The phase of the second clock signal CK2 is adjusted based on the phase difference Sh calculated by the phase difference computation circuit 109, whereby the center data Ds in an adequate phase may be checked and the check error rate may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A receiving circuit comprising:
    a sampling circuit configured to sample an input data signal in synchronization with a first clock signal to obtain boundary data, and sample the input data signal in synchronization with a second clock signal to obtain center data;
    a decision feedback equalizer configured to perform equalization and binary decision on the center data using an equalization coefficient, and output a first output data signal;
    a first comparator circuit configured to perform binary decision on the boundary data and output a second output data signal;
    a phase detection circuit configured to detect phase information of the input data signal based on the first output data signal and the second output data signal;
    a phase difference computation circuit configured to calculate a phase difference of the first output data signal based on the equalization coefficient;
    a first phase adjustment circuit configured to adjust a phase of the first clock signal based on the phase information; and
    a second phase adjustment circuit configured to adjust a phase of the second clock signal based on the phase information and the phase difference.

2. The receiving circuit according to claim 1, further comprising:
    a second comparator circuit configured to compare the center data with a threshold.

3. The receiving circuit according to claim 2,
    wherein the phase difference computation circuit configured to calculate the phase difference of the first output data signal based on the equalization coefficient and the comparison result from the second comparator circuit.

4. The receiving circuit according to claim 1,
wherein the equalization coefficient has a first equalization coefficient and a second equalization coefficient, and
wherein the decision feedback equalizer outputs a first comparison result or a second comparison result in accordance with a previous first output data signal, the first comparison result being a comparison result between the center data and the first equalization coefficient, the second comparison result being a comparison result between the center data and the second equalization coefficient.

5. The receiving circuit according to claim 1,
wherein the sampling circuit receives the input data signal including a specific data pattern in an initial operation.

6. The receiving circuit according to claim 1, further comprising:
an equalizer configured to equalize the input data signal and that supplies the equalized input data signal to the sampling circuit.

7. The receiving circuit according to claim 1, further comprising:
a filter configured to filter the phase information,
wherein the first phase adjustment circuit configured to adjust the phase of the first clock signal based on the phase information, and
wherein the second phase adjustment circuit configured to adjust the phase of the second clock signal based on the phase information and the phase difference.

8. The receiving circuit according to claim 1, further comprising:
an adaptive logic circuit configured to calculate the equalization coefficient of the decision feedback equalizer based on the first output data signal.

9. The receiving circuit according to claim 1, further comprising:
an inverse multiplexing circuit configured to inversely multiplex the first output data signal and the second output data signal,
wherein the phase detection circuit detects the phase information based on an output data from the inverse multiplexing circuit.

10. A control method of a receiving circuit, the method comprising:
sampling an input data signal in synchronization with a first clock signal to output a first sampling signal as boundary data;
sampling the input data signal in synchronization with a second clock signal to output a second sampling signal as center data;
performing equalization and binary decision on the second sampling signal by using an equalization coefficient of a decision feedback equalizer to output a first output data signal;
performing binary decision on the first sampling signal to output a second output data signal;
detecting phase information of the input data signal based on the first output data signal and the second output data signal;
calculating a phase difference of the first output data signal based on the equalization coefficient;
adjusting a phase of the first clock signal based on the phase information; and
adjusting a phase of the second clock signal based on the phase information and the calculated phase difference.

11. The control method according to claim 10, further comprising:
comparing the center data with a threshold; and
calculating the phase difference of the first output data signal based on the equalization coefficient and a comparison result.

12. The control method according to claim 10, further comprising:
outputting a first comparison result or a second comparison result in accordance with a previous first output data signal, the first comparison result being a comparison result between the center data and a first equalization coefficient included in the equalization coefficient, the second comparison result being a comparison result between the center data and a second equalization coefficient included in the equalization coefficient.

13. The control method according to claim 10, further comprising:
equalizing the input data signal before the sampling.

14. The control method according to claim 11, further comprising:
filtering the phase information;
adjusting the phase of the first clock signal based on the phase information; and
adjusting the phase of the second clock signal based on the phase information and the phase difference.

15. The control method according to claim 11, further comprising:
calculating the equalization coefficient of the decision feedback equalizer based on the first output data signal.

16. The control method according to claim 11, further comprising:
multiplexing inversely the first output data signal and the second output data signal; and
detecting the phase information based on a multiplexed result.

* * * * *

UNITED STATES PATENT AND TRADEMARK OFFICE
CERTIFICATE OF CORRECTION

| | | |
|---|---|---|
| PATENT NO. | : 8,791,735 B1 | Page 1 of 1 |
| APPLICATION NO. | : 14/173515 | |
| DATED | : July 29, 2014 | |
| INVENTOR(S) | : Takayuki Shibasaki | |

It is certified that error appears in the above-identified patent and that said Letters Patent is hereby corrected as shown below:

On the Title Page, Foreign Application Priority Data reads:

Item (22) Filed:    Feb. 5, 2014

Item (51) Int. Cl.
    H03L 7/06   (2006.01)

should read:

Item (22) Filed:    Feb. 5, 2014

Item (30)        Foreign Application Priority Data

Apr. 3, 2013        (JP) .............................. 2013-077887

Item (51) Int. Cl.
    H03L 7/06   (2006.01)

Signed and Sealed this
Seventeenth Day of March, 2015

Michelle K. Lee
*Director of the United States Patent and Trademark Office*